United States Patent [19]

Dunbar

[11] Patent Number: 4,547,421
[45] Date of Patent: Oct. 15, 1985

[54] HIGHLY DISPERSED CONTINUOUS GLASS FIBER MATS

[75] Inventor: Sidney G. Dunbar, Granville, Ohio

[73] Assignee: Owens-Corning Fiberglas Corporation, Toledo, Ohio

[21] Appl. No.: 663,272

[22] Filed: Oct. 22, 1984

[51] Int. Cl.⁴ .............................................. B32B 31/08
[52] U.S. Cl. .................................. 428/285; 65/9; 428/286; 428/287; 428/288; 428/290; 428/300
[58] Field of Search ............... 428/285, 286, 287, 288, 428/290, 300; 65/9

[56] References Cited

U.S. PATENT DOCUMENTS 4,469,543  9/1984  Segal et al. ............................ 428/285

Primary Examiner—Marion E. McCamish
Attorney, Agent, or Firm—Ronald C. Hudgens; Greg Dziegielewski

[57] ABSTRACT

A mat comprised of at least one layer of highly dispersed continuous glass fiber strands is produced according to defined parameters for use in reinforcing thermoplastic as well as thermosetting materials.

20 Claims, 4 Drawing Figures

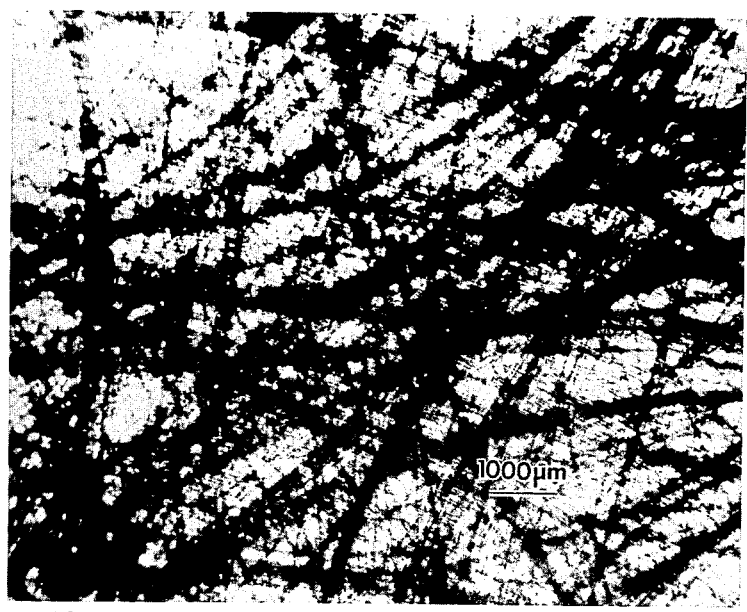
FIG. 1
FIG. 2 (PRIOR ART)
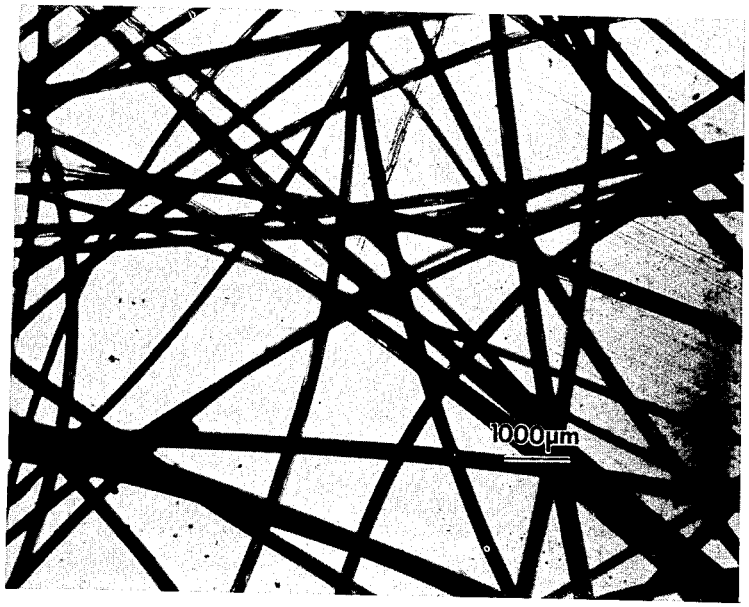

HIGHLY DISPERSED CONTINUOUS GLASS FIBER MATS

TECHNICAL FIELD

The invention disclosed herein relates to a highly dispersed continuous glass fiber mat primarily utilized as a reinforcement for thermoplastic and thermoset resins.

BACKGROUND ART

As the needs of fiberglass reinforced resinous articles and sheets become more specialized, the properties of the reinforcing mats of glass filaments have become more highly engineered. For example, mats comprised of continuous glass filaments for use in stampable thermoplastics required the ability to "flow" with the resin in the stamping operation to provide adequate reinforcement throughout the article. Some of the previous mat-producing systems even go so far as to first produce a mat of a plurality of layers of continuous glass filaments and then needlepunch the mat to, first, mechanically bond the mat together and, secondly, "break" the filaments to render the mat useful for reinforcing resinous sheets that are to be stamped. For example, see U.S. Pat. Nos. 3,883,333 and 4,277,531.

According to the '531 patent, the broken filaments move with the resin during the stamping operation to ensure that the resin flowing to the ends of the mold is properly reinforced with glass. Unfortunately, mats of such "chopped or severed" strands are generally not as strong as those produced from continuous strands. In an example set forth in that patent, it was specified that there be over 500 needle penetrations, by a barbed needle, per square inch. Clearly, the damage to the previously continuous strands will be rather severe.

On the other hand, continuous strand mats produced according to the principles set forth in U.S. Pat. Nos. 3,295,942; 3,854,917 and 3,969,171 also find utility for use in producing printed circuit boards. Such printed circuit boards are generally comprised of a continuous strand mat of glass fibers and a thermosetting resin, such as polyester. One of the requirements of printed circuit boards is that they have good "punchability" to permit clean holes to be punched in the boards for installation of appropriate electrical terminations and/or fittings.

The present invention provides a mat capable of satisfying the requirements of "punchability" as well as "flowability" for use in printed circuit boards and stampable thermoplastics, respectively.

DISCLOSURE OF THE INVENTION

This invention pertains to a fibrous mat wherein at least one layer is comprised of a plurality of bundles of continuous glass filaments having from about 1 to about 54 filaments per bundle, the filaments having diameters within the range from about 20 HT to about 150 HT, said bundles intersecting one another defining open sections therebetween, the number of intersections of said bundles falling within the range from about 60 to about 210 intersections per mm², the area of said open sections falling within the range from about $3.4 \times 10^2$ to about $4.0 \times 10^4$ $\mu m^2$.

BRIEF DESCRIPTION OF THE DRAWINGS

FIG. 1 is a photograph of a single layer mat produced according to the principles of this invention.

FIG. 2 is a photograph of a single layer mat of continuous glass strands produced according to the principles of the prior art.

BEST MODE OF CARRYING OUT THE INVENTION

Figure 3:
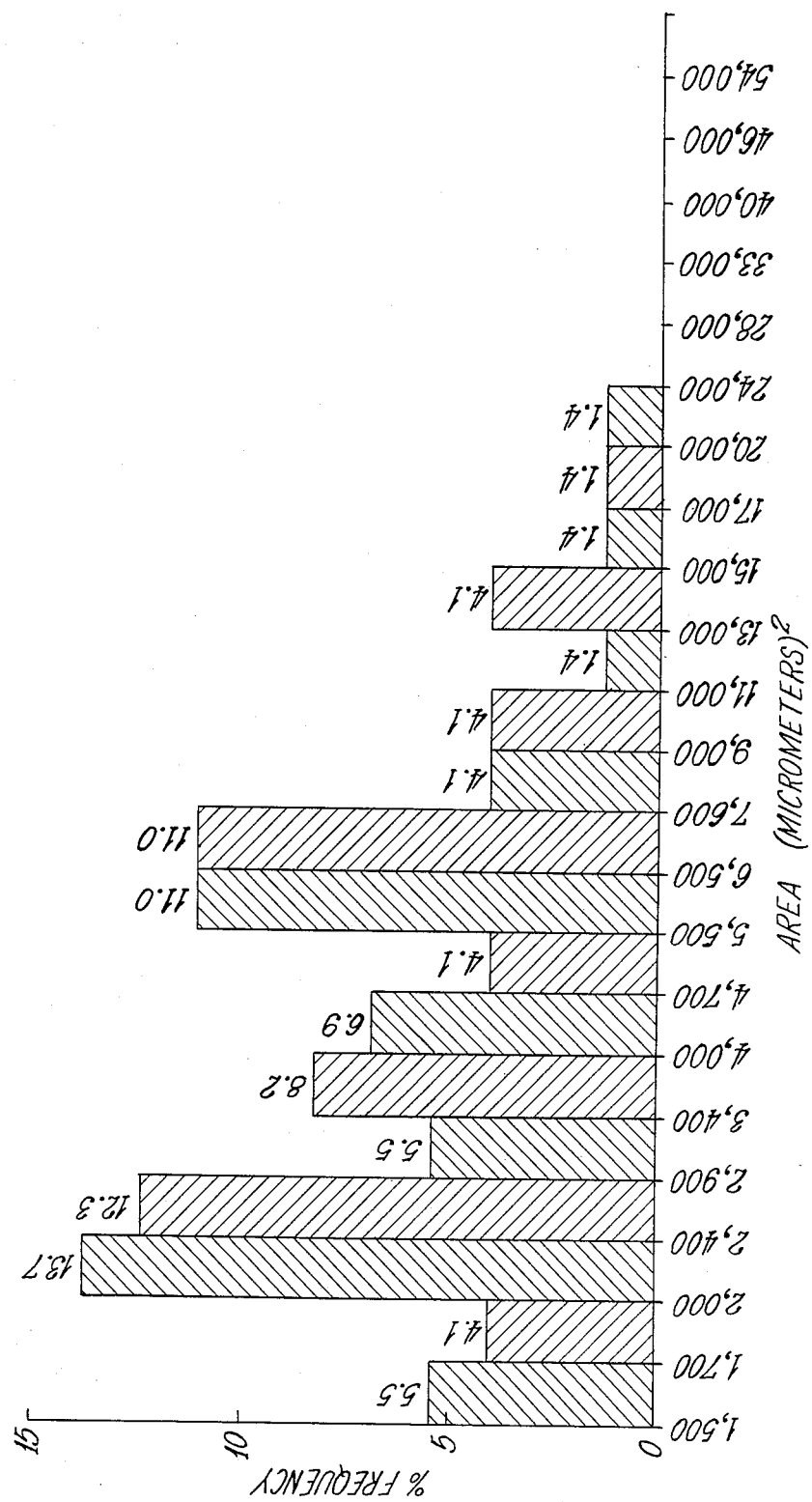
FIG. 3 is a graph showing the distribution of the open sections or apertures formed among the intersecting filaments and strands of a mat similar to that shown in FIG. 1.

According to the principles of this invention, the unique mat, which is comprised of highly dispersed or highly filamentized continuous glass fiber strands, is produced by drawing streams of molten glass into continuous filaments; orienting said filaments as a substantially planar band of substantially parallel bundles of filaments; contacting said band with a substantially planar gaseous stream; moving said gaseous stream in contact with said bundles through a divergent section and then through a convergent section to reduce the velocity of the gaseous stream and bundles and to impart lateral movement to pre-selected bundles of said filaments to advance said bundles as a diverging planar array having a substantially greater at the width collection surface than the width of the band at the point of initial contact with said gaseous stream; and collecting said filaments as said mat on a continuously advancing collection surface.

The foregoing process for producing the instant invention is set forth in U.S. patent application Ser. No. 520,091 filed Aug. 4, 1983 in the name of David C. K. Lin, which is now U.S. Pat. No. 4,496,385 issued on Jan. 29, 1985 which is hereby incorporated by reference herein.

It is to be understood that the mat produced according to the principles of this invention may be but a single layer or a plurality of layers all of which may be layers produced according to the principles of this invention. Further, different mats incorporating a layer or layers of mat produced according to the principles of this invention may be combined with other types of mats or layers such as those produced from chopped glass fibers or mats produced from continuous or discontinuous polymeric filaments.

To produce a typical continuous glass fiber mat as a reinforcement for thermoplastic resins, such as polypropylene or polyphenylsulfide and the like, a plurality of the units set forth in the aforementioned patent application are serially aligned along the length of the conveyor to produce a mat of many layers. Typically, the distribution means set forth in the aforementioned patent application is desirably operated from about 0.3 to about 3.0 oscillations per foot of collection conveyor travel with from about 0.5 to about 2.0 oscillations per foot of conveyor travel being preferred.

To produce the layer of mat according to the principles of this invention, it is desirable that the glass filaments have diameters within the range from about 20 HT to about 150 HT. "HT" corresponds to per one hundred thousandths of an inch. As such, a fiber having a diameter of 60 HT has a diameter of 60 one hundred thousandths of an inch (0.00060 inches). Preferably, the diameters of the filaments fall within the range from about 60 HT to about 120 HT.

Desirably, the continuous filaments are grouped in bundles in the mat containing from about 1 to about 54 filaments per bundle, and preferably from about 1 to about 12 filaments per bundle.

Once the bundles of filaments have been deposited upon the collecting conveyor, a suitable binder may be applied as is known in the art. Although it is preferable that "resinous" types of binders be employed to bond the bundles and filaments to one another as well as the layers to one another that are compatible with the intended resinous matrix, it is to be understood that mechanical bonding, such as by needlepunching, may also be employed, if desired. Such resinous types of binders may be applied in either a dry or wet process similar to that shown in U.S. Pat. Nos. 3,908,591; 3,936,558 and 3,969,171. One such binder formulation is set forth in U.S. Pat. No. 4,358,502.

As the dispersed bundles of filaments are deposited upon the advancing collection surface, the bundles tend to loop over one another in a random fashion. When viewing the mat thus formed, the bundles of filaments appear to cross over or intersect one another thereby defining open sections between or among the intersecting bundles and/or filaments. Desirably, the number of intersections or crossovers of such bundles falls within the range from about 60 to about 210 intersections per $mm^2$, and preferably, the number of intersections of bundles falls within the range from about 70 to about 185 intersections per $mm^2$.

As can be seen in FIGS. 1 and 2, the mat or layer of the instant invention has far many more crossovers or intersections than the prior art mat shown in FIG. 2. Further, it is easily seen that the bundles of the instant invention contain far fewer filaments per bundle than the bundles of filaments of the prior art mat as shown in FIG. 1.

Also, it is clear that the open sections or areas defined by the intersecting bundles are much smaller than the open areas formed by the intersecting bundles of strand of the mat shown in FIG. 1. Desirably, the area of the open section falls within the range from about $3.4 \times 10^2$ $\mu m^2$ to about $4.0 \times 10^4$ $\mu m^2$. Preferably, the open sections have an area falling within the range from about $5.0 \times 10^2$ $\mu m^2$ to about $3.4 \times 10^4$ $\mu m^2$.

Figure 4:
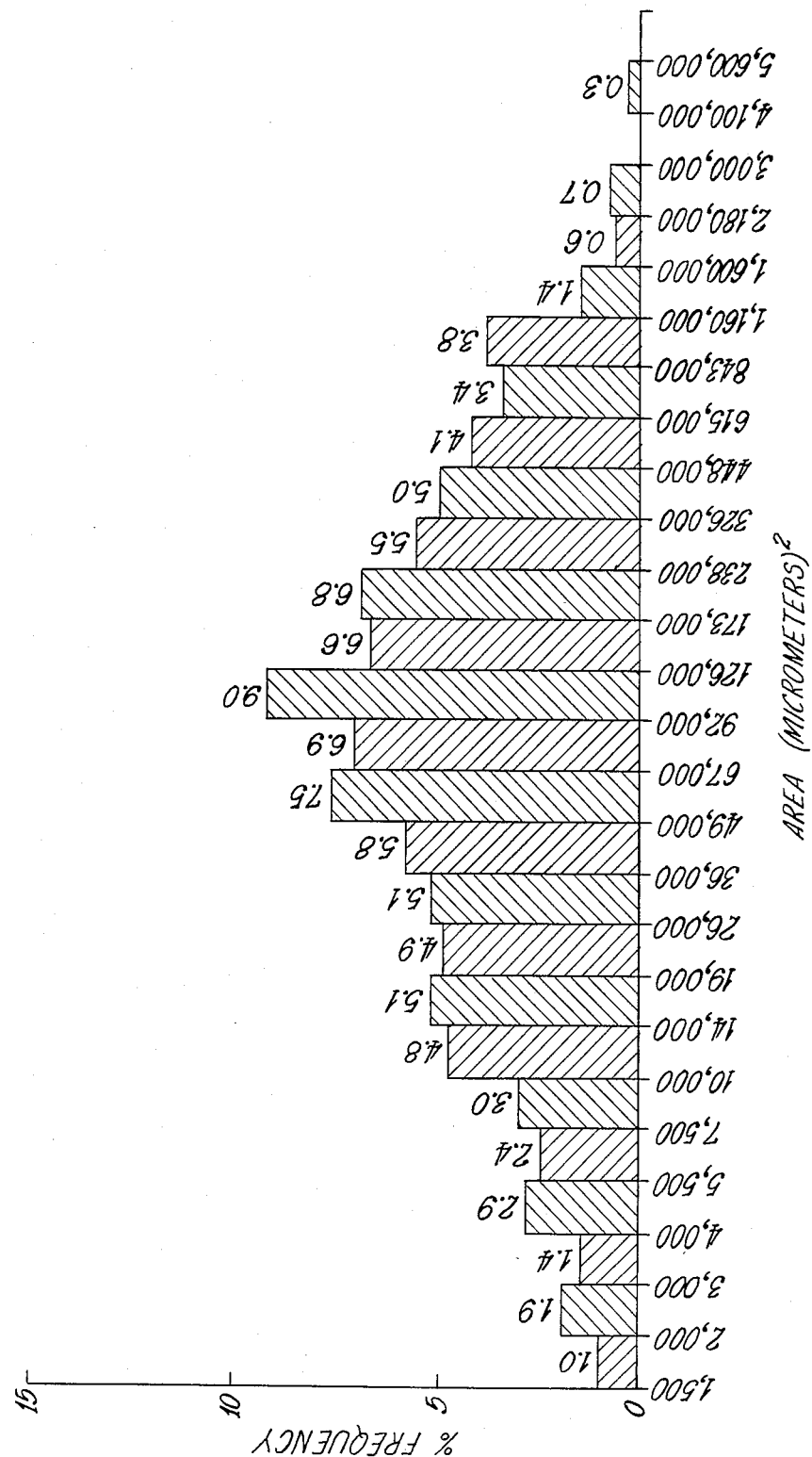
FIG. 4 is a graph showing the distribution of the apertures formed between the intersecting strands of a mat similar to that shown in FIG. 2.

For comparison purposes, the percent frequency of occurrence of the area of the open sections of the mat of the instant invention shown in FIG. 3 versus the prior art mat shown in FIG. 4 is displayed in graphic form. Upon inspection, it is seen that the largest segment of the areas shown in FIG. 3 is smaller than about 75 percent of those areas shown in FIG. 4. Also, the largest area of the open sections shown in FIG. 3 ranging from 20,000 to 24,000 $mm^2$ is much smaller than the $4.1 \times 10^6$ to $5.6 \times 10^6$ $mm^2$ area range shown in FIG. 4.

Typically, a mat produced according to the principles of this invention containing all continuous glass filament layers will have from about 6 to about 36 layers, although mats produced with fewer or more layers are within the scope of this invention. Further, a typical mat produced according to the principles of this invention has a weight of less than 2 ounces per square foot, although heavier mats may be produced.

With the mat of the instant invention, the porosity, which is a measure of strand dispersion, was substantially lower than that of a mat similar to that shown in FIG. 2 as measured on a Frazier differential pressure air permeability measuring machine. As measured, a mat similar to that shown in FIG. 1 exhibited an air flow of less than or equal to 500 $CFM/Ft^2$ at a differential pressure of 0.5 inch of $H_2O$.

It is to be understood that such continuous strand mats need not have all the layers be produced according to the principles of the instant invention. For example, a portion of the layers may be produced according to the principles of this invention, and the remaining layers may be produced according to the prior art systems for producing continuous strand mats of glass filaments. Such layers may be alternated or arranged in any other manner as desired. Further, such "mixed" continuous strand mats may be further joined to or interspersed with layers of discrete glass fibers and/or continuous or discrete polymeric filaments.

It is apparent that within the scope of the present invention, modifications and different arrangements can be made other than as herein disclosed. The present disclosure is merely illustrative with the invention comprehending all variations thereof.

INDUSTRIAL APPLICABILITY

The invention described herein is readily applicable to the glass fiber and glass fiber reinforced plastics industries.

I claim:

1. A fibrous mat comprising a plurality of layers wherein at least one of the layers is comprised of a plurality of bundles of continuous glass filaments intersecting one another defining open sections therein, the number of intersections of said bundles being within the range from about 60 to about 210 intersections per $mm^2$, the area of said open sections being within the range from about $3.4 \times 10^2$ to about $4.0 \times 10^4$ $\mu m^2$.

2. The mat of claim 1 wherein said bundles have from about 1 to about 54 filaments per bundle, said filaments having diameters within the range from about 20 HT to about 150 HT.

3. The mat of claim 1 wherein at least one of the other layers of said mat are comprised of glass fibers.

4. The mat of claim 3 wherein said glass fibers of the other layer are continuous.

5. The mat of claim 1 wherein the number of intersections of bundles is within the range from about 70 to about 185 intersections per $mm^2$.

6. The mat of claim 5 wherein the area of said open sections is within the range from about $5.0 \times 10^2$ to about $3.4 \times 10^4$ $\mu m^2$.

7. The mat of claim 6 wherein the diameters of the filaments are within the range from about 60 HT to about 120 HT.

8. A sheet of resinous material containing the mat of claim 1.

9. The sheet of claim 8 wherein said resinous material is a thermoplastic material.

10. The sheet of claim 8 wherein said resinous material is a thermosetting material.

11. The mat of claim 1 wherein all of the other layers are comprised of glass filaments.

12. The mat of claim 11 wherein the porosity of the mat is less than or equal to 500 $CFM/ft^2$ at a differential pressure of 0.5 inch of $H_2O$.

13. The mat of claim 11 wherein weight of the mat is less than 2.0 $oz/ft^2$.

14. The mat of claim 11 wherein said mat has from about 6 to about 36 layers.

15. The mat of claim 1 further comprising a resinous binder to join said bundles and layers together.

16. The mat of claim 1 wherein said layers are needlepunched together.

17. A fibrous mat comprising at least one layer of a plurality of bundles of continuous glass filaments intersecting one another defining open sections therein, the number of intersections of said bundles being within the range from about 60 to about 210 intersections per mm$^2$, the area of said open sections being within the range from about $3.4 \times 10^2$ to about $4.0 \times 10^4$ $\mu$m$^2$.

18. The mat of claim 1 wherein said bundles have from about 1 to about 54 filaments per bundle, the filaments having diameters within the range from about 20 HT to about 150 HT.

19. The mat of claim 17 wherein the number of intersections of bundles is within the range from about 70 to about 185 intersections per mm$^2$.

20. The mat of claim 19 wherein the area of said open sections falls within the range from about $5.0 \times 10^2$ to about $3.4 \times 10^4$ $\mu$m$^2$.

* * * * *